May 26, 1964 AKIRA KAWAJI 3,134,699

METHOD OF MANUFACTURING SEMICONDUCTOR DEVICES

Filed July 25, 1961

INVENTOR.
AKIRA KAWAJI

BY Roy C. Hopgood
ATTORNEY

United States Patent Office 3,134,699

Patented May 26, 1964

3,134,699
METHOD OF MANUFACTURING SEMICONDUCTOR DEVICES

Akira Kawaji, Tokyo, Japan, assignor to Nippon Electric Company, Limited, Tokyo, Japan, a corporation of Japan Filed July 25, 1961, Ser. No. 126,562
2 Claims. (Cl. 148—1.5)

This invention relates to a method of manufacturing semiconductor devices and more particularly to a cold bonding process by which a cold pressure bond can be formed between a semiconductor material and a metal which is normally unbondable to the semiconductor material. The process is useful in the manufacture of fused junction semiconductor devices of all types.

In manufacturing transistors by the alloying method, low melting point metals such as indium, lead alloys, or the like are fused and recrystallized on a semiconductor base plate to form both the emitter and collector junctions of the transistor. (This process will be hereafter called "fusion bonding.") Before the fusion bonding, the metals to be fusion bonded to the semiconductor should be fixed at definite positions on the semiconductor surface. For this purpose, either of the following methods have been used in the prior art: (1) the metal piece is held in place by a jig made of graphite or stainless steel in such a way that the metal piece does not move during fusion bonding process; or (2) the metal piece is cold pressed at a predetermined position on the semiconductor base plate to secure the metal in position by means of a cold pressure bond which is strong enough to hold until the fusion bond is formed in the heat treating furnace. Method (1) has the disadvantage of requiring the jig and its accoutrements, and in mass production a large amount of loss occurs in the jig by repeated heating and cooling. Moreover, the electrical characteristics of the products are changed by impurities introduced into the metal from the jig. The cold bonding method is more effective because fusion bonding can be carried out without aforementioned difficulties, but cold pressure bonding has been of limited utility in the past because the metal and semiconductor material in question are not always capable of being bonded together by pressure alone. Thus cold bonding has heretofore been limited in that the materials to be cold pressure bonded had to be limited to a special kind. For an example, in the collector junction of a germanium PNP type alloy transistor, pure indium is used as the alloying metal and cold pressure bonding is very easy. In emitter junction, however, an alloy of indium and gallium is usually used to improve the efficiency of hole injection. But cold pressure bonding an indium-gallium alloy to germanium is very difficult. This is due to the fact that gallium is easily oxidized and forms a eutectic with indium, thus making the surface noncohesive and resistant to cold pressure bonding. In the case of an NPN type alloy transistor, it is necessary to use an alloy containing arsenic and antimony in both emitter and collector junctions, and these alloys are also very reluctant to be cold pressure bonded onto a germanium surface. Thus cold pressure bonding, as practiced in the prior art, has been seriously limited in utility.

Accordingly, one object of this invention is to provide a novel method of manufacturing semiconductor devices in which a cold pressure bond can be formed between a semiconductor material and a metal which is normally unbondable to the semiconductor material.

Another object of this invention is to provide a novel method of producing a cold pressure bond between a semiconductor material and a metal which is normally unbondable to the semiconductor material.

Other objects and advantages of the invention will be apparent to those skilled in the art from the following description of one illustrative embodiment of the invention, as illustrated by the attached drawings, in which.

In accordance with the novel method of this invention the limitation of the cold bonding process to certain types of metals is avoided by forming the desired alloy after the materials have been inserted in the heat treating furnace rather than before. For example, in place of an indium-gallium alloy, which cannot be cold pressure bonded to germanium, a sandwich of indium-gallium alloy and pure indium are used in the novel method of this invention. The indium-gallium alloy can be cold pressure bonded to indium, and the indium can be cold pressure bonded to germanium, and therefore the three materials can be cold pressure bonded together by placing the indium in contact with the germanium and the indium-gallium alloy in contact with the indium. When this bonded assembly is placed in a heat treating furnace, the indium-gallium alloy will become alloyed with the pure indium before the recrystalized region is formed so that the recrystalized region will contain gallium as well as indium. In other words, the desired indium-gallium alloy is formed by the heat which must be applied to form the recrystalized zone between the alloy and the semiconductor material.

Figure 1:
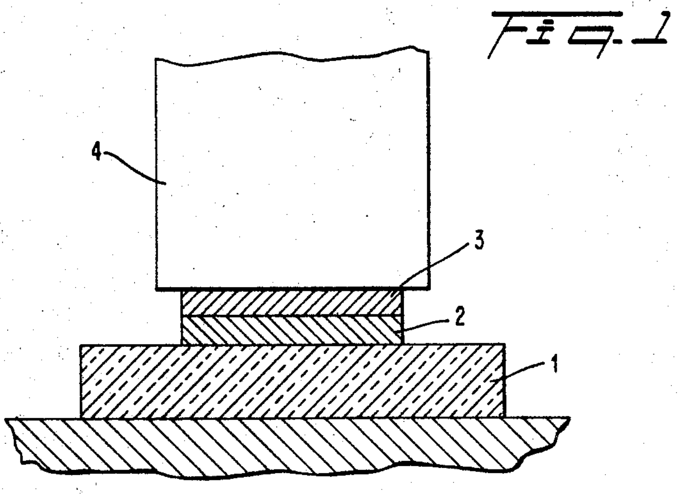
FIG. 1 is an elevation section showing a metal being cold pressed onto a semiconductor material in accordance with the novel method of this invention.
Figure 2:
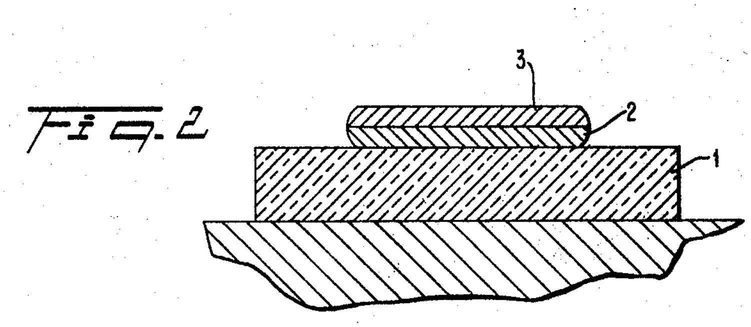
FIG. 2 is an elevation section showing the metal and semiconductor materials of FIG. 1 after a cold pressure bond has been formed thereinbetween.
Figure 3:
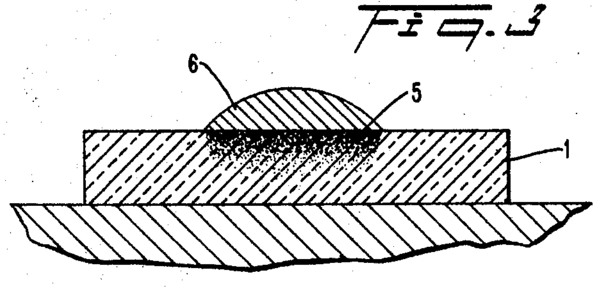
FIG. 3 shows the semiconductor junction formed when the cold bonded materials of FIG. 2 have been fused together in a heat treating furnace to form a recrystalized region thereinbetween.

The above described process is illustrated in the drawings. FIG. 1 shows a germanium wafer 1, an indium wafer 2, and an indium-gallium wafer 3 being bonded together by pressure applied by a ram 4. FIG. 2 shows the materials of FIG. 1 after they have been joined together by cold pressure bonding. It will be noted that metals 2 and 3 have been slightly flattened by the pressure and that their edges have been rounded by plastic flow. FIG. 3 shows the materials of FIG. 2 after they have been fused together in a heat treating furnace to form a recrystalized region 5. Very early in the heat treating process metals 2 and 3 mix together to form a new indium-gallium alloy 6, and recrystalized region 5 takes its character from the nature of alloy 6. It will be apparent, therefore, that the dimensions and characteristics of metals 2 and 3 must be selected so as to produce the desired alloy 6 when the metals are mixed together in the heat treating process. The exact composition and dimensions of the metals cannot be specified in general, because they will differ according to the nature of the semiconductor device being manufactured, but these parameters can be determined by well known prior art techniques to produce any desired type of fused junction semiconductor device.

The above described example shows how the novel method of this invention can be used to form the emitter junction of a germanium PNP type alloy transistor, but the method of this invention is by no means limited to this specific application. For example, the method can also be used for the emitter and collector junctions of a germanium NPN type alloy transistor by using an indium-arsenic alloy or an indium-antimony alloy in place of the indium-gallium alloy described above.

It will be apparent from the foregoing description that this invention provides a novel method of manufacturing semiconductor devices in which a cold pressure bond can be formed between a semiconductor material and a metal which is normally unbondable to the semiconductor material. And it should be understood that this invention is by no means limited to the specific examples described herein since many modifications can be made in the examples disclosed without departing from the basic teaching of this invention. For example, instead of using a wafer of indium and a wafer of indium-gallium alloy it is possible to use a wafer of indium which has gallium blown and deposited on one side thereof. In addition, many other suitable metals and metal alloys can be used in place of the indium, indium-gallium, indium-arsenic, and indium-antimony disclosed herein. These and many other modifications will be apparent to those skilled in the art, and this invention includes all modifications falling within the scope of the following claims.

I claim:

1. In a method of producing a semiconductor device comprising an alloy bonded to germanium, the improvement comprising placing an indium wafer on a germanium wafer, and placing a wafer consisting of indium and gallium on said indium wafer, to thereby form an assembly of said wafers, applying pressure to said assembly to bond said indium wafer to said germanium wafer and also to said indium-gallium wafer applying heat to melt said indium wafer and said indium-gallium wafer to form said alloy, and continuing said heating to form a zone of recrystallization at the surface of said germanium wafer as a result of the interaction of said alloy therewith.

2. In a method of producing a semiconductor device comprising an alloy selected from the group consisting of indium-gallium, indium-antimony and indium-arsenic bonded to germanium, the improvement comprising placing an indium wafer on a germanium wafer, and placing a wafer selected from the group consisting of indium-gallium, indium-antimony and indium-arsenic on said indium wafer, to thereby form an assembly of said wafers, applying pressure to said assembly to bond said indium wafer to said germanium wafer and also to said wafer selected from the group consisting of indium-gallium, indium-antimony and indium-arsenic, applying heat to melt said indium wafer and said wafer selected from the group consisting of indium-gallium, indium-antimony and indium-arsenic to form said alloy, and continuing said heating to form a zone of recrystallization at the surface of said germanium wafer as a result of the interaction of said alloy therewith.

References Cited in the file of this patent

UNITED STATES PATENTS

| | | |
|---|---|---|
| 2,705,768 | Kleimack et al. | Apr. 5, 1955 |
| 2,817,607 | Jenny | Dec. 24, 1957 |
| 2,830,920 | Colson et al. | Apr. 15, 1958 |
| 2,833,678 | Armstrong et al. | May 6, 1958 |
| 2,959,502 | Gaertner | Nov. 8, 1960 |